(12) United States Patent
Eo

(10) Patent No.: US 12,207,489 B2
(45) Date of Patent: Jan. 21, 2025

(54) MANUFACTURING METHOD OF COVER WINDOW FOR FLEXIBLE DISPLAY DEVICE AND MANUFACTURING METHOD OF FLEXIBLE DISPLAY DEVICE

(71) Applicant: SAMSUNG DISPLAY CO., LTD., Yongin-si (KR)

(72) Inventor: Sung Woo Eo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 449 days.

(21) Appl. No.: 17/732,839

(22) Filed: Apr. 29, 2022

(65) Prior Publication Data
US 2023/0071528 A1   Mar. 9, 2023

(30) Foreign Application Priority Data

Sep. 6, 2021   (KR) ........................ 10-2021-0118199

(51) Int. Cl.
| | |
|---|---|
| *C03C 15/00* | (2006.01) |
| *H10K 50/84* | (2023.01) |
| *H10K 59/12* | (2023.01) |
| *H10K 59/40* | (2023.01) |
| *H10K 71/00* | (2023.01) |
| *H10K 77/10* | (2023.01) |
| *H10K 102/00* | (2023.01) |

(52) U.S. Cl.
CPC ........... *H10K 50/841* (2023.02); *C03C 15/00* (2013.01); *H10K 59/12* (2023.02); *H10K 59/40* (2023.02); *H10K 71/00* (2023.02); *H10K 77/111* (2023.02); *H10K 2102/311* (2023.02)

(58) Field of Classification Search
CPC ....................................... C03C 15/00
See application file for complete search history.

(56) References Cited

U.S. PATENT DOCUMENTS

| | | | |
|---|---|---|---|
| 10,295,818 B2 | 5/2019 | Nam et al. | |
| 2014/0354938 A1* | 12/2014 | Kim | ..... B32B 38/1866 |
| | | | 156/345.19 |
| 2021/0107826 A1* | 4/2021 | Hwang | ........ C03C 21/002 |

FOREIGN PATENT DOCUMENTS

| | | | | |
|---|---|---|---|---|
| CN | 112939474 A | * | 6/2021 | ............ C03C 15/00 |
| KR | 101373306 B1 | * | 3/2014 | ......... H01L 21/6708 |
| KR | 20150021755 A | * | 3/2015 | ............ H10K 71/00 |
| KR | 10-2016-0150007 | | 12/2016 | |
| KR | 10-2017-0122554 | | 11/2017 | |
| KR | 10-2111138 | | 5/2020 | |
| KR | 102167404 B1 | * | 10/2020 | ............ C03C 15/00 |
| KR | 102272926 B1 | * | 7/2021 | ......... C03C 23/0095 |
| WO | WO-2013099893 A1 | * | 7/2013 | ............ C03C 15/00 |
| WO | WO-2021041882 A1 | * | 3/2021 | ........... C03C 21/002 |

* cited by examiner

*Primary Examiner* — Alison L Hindenlang
*Assistant Examiner* — Steven S Lee
(74) *Attorney, Agent, or Firm* — F. CHAU & ASSOCIATES, LLC

(57) ABSTRACT

A manufacturing method of a cover window of a flexible display device includes attaching a glass substrate to a jig including a hinge. The jig and the glass substrate are folded around the hinge. The glass substrate is immersed in an etchant to etch the glass substrate.

20 Claims, 14 Drawing Sheets

MANUFACTURING METHOD OF COVER WINDOW FOR FLEXIBLE DISPLAY DEVICE AND MANUFACTURING METHOD OF FLEXIBLE DISPLAY DEVICE

CROSS-REFERENCE TO RELATED APPLICATION

This application claims priority under 35 U.S.C. § 119 to Korean Patent Application No. 10-2021-0118199, filed on Sep. 6, 2021 in the Korean Intellectual Property Office, the disclosure of which is incorporated by reference in its entirety herein.

1. TECHNICAL FIELD

The present disclosure relates to a flexible display device, a cover window for a flexible display device, a manufacturing method of a cover window for a flexible display device, and a manufacturing method of a flexible display device including a cover window.

2. DISCUSSION OF RELATED ART

Various types of electronic devices include display devices for displaying images, such as mobile phones, tablets, multimedia players, and televisions. The display device includes a display panel having a screen for displaying an image. A flexible display device that includes a flexible display panel having a flexible substrate is being developed.

The flexible display device may include a cover window that may transmit the image displayed on the flexible display panel while protecting the flexible display panel from the environment (e.g., an external impact, etc.). Glass may be used as the cover window. When the cover window is formed to be relatively thin, the flexible characteristic of the cover window may be increased, but impact resistance may decrease.

SUMMARY

Embodiments of the present disclosure provide a manufacturing method of a cover window capable of thinly forming a predetermined region of a cover window and increasing a required characteristic of the cover window, and a manufacturing method of a flexible display device including such a cover window.

According to an embodiment of the present disclosure, a manufacturing method of a cover window of a flexible display device includes attaching a glass substrate to a jig including a hinge. The jig and the glass substrate are folded around the hinge. The glass substrate is immersed in an etchant to etch the glass substrate.

In an embodiment, the glass substrate may include a bent portion adjacent to the hinge due to the folding, and the etching may include first immersing a first portion of the glass substrate that includes the bent portion in the etchant.

In an embodiment, the etching may include immersing the glass substrate into the etchant gradually from the first portion to a second portion of the glass substrate that does not include the bent portion.

In an embodiment, the gradual immersing may include an immersing at a speed at which a difference in etch amount between first and last immersed parts of the glass substrate is about 30% or more.

In an embodiment, the attaching may include using an adhesive member that does not react with the etchant to attach the glass substrate to the jig.

In an embodiment, the adhesive member may be a two-sided adhesive tape.

In an embodiment, the adhesive member may be a photocurable resin or a photoresist.

In an embodiment, the folding may include folding the jig and the glass substrate so that the glass substrate is exposed outside.

In an embodiment, the folding may include folding the jig and the glass substrate so that the jig is disposed in a space defined by the glass substrate.

In an embodiment, the folding may include folding the glass substrate substantially into a U shape or a V shape.

According to an embodiment of the present disclosure, a manufacturing method of a flexible display includes attaching a glass substrate to a jig. The jig and the glass substrate are folded. A cover window having a thickness that gradually increases from a center to an edge is formed by wet etching the glass substrate in an etchant. A display panel is attached to the cover window.

In an embodiment, the glass substrate may include a bent portion due to the folding. The etching may include first immersing a first portion of the glass substrate that includes the bent portion in the etchant.

In an embodiment the etching may include immersing the glass substrate into the etchant gradually from the first portion to a second portion of the glass substrate that includes the edge.

In an embodiment, the gradual immersing may include an immersing at a speed at which a difference in etch amount between first and last immersed parts of the glass substrate is about 30% or more.

In an embodiment, the attaching may include using an adhesive member that is not etched by an etchant to attach the glass substrate to the jig.

In an embodiment, the method may include attaching a concave surface of the cover window etched by the etching and a protection layer to each other by an adhesive layer having an adhesive. The concave surface of the cover window may be filled with the adhesive.

In an embodiment, the attaching of the display panel to the cover window may include attaching the concave surface of the cover window etched by the etching to the display panel by an adhesive layer having an adhesive. The concave surface of the cover window may be filled with the adhesive.

In an embodiment, the folding may include folding the jig and the glass substrate so that the glass substrate is exposed outside.

In an embodiment, the folding may include folding the jig and the glass substrate so that the jig is disposed in a space defined by the glass substrate.

In an embodiment, the folding may include folding the glass substrate substantially into a U-shape or a V-shape.

According to embodiments of the present disclosure, a predetermined region (e.g., the bendable region) of the cover window may be formed relatively thinner, and impact resistance and a flexible characteristic of the cover window may be increased. In addition, the yield of the cover window may be increased, and it may be advantageous for stabilizing external dimensions. In addition, a glass substrate forming the cover window may be etched so that the thickness gradually increases from the relatively thin part to the relatively thick part, and it is possible to provide the cover window in which the boundary between the thin region and the thick region is not visible. Also, unless otherwise stated, an embodiment of the present disclosure may provide an effect that may be recognized throughout the specification.

DETAILED DESCRIPTION OF EMBODIMENTS

Figure 1:
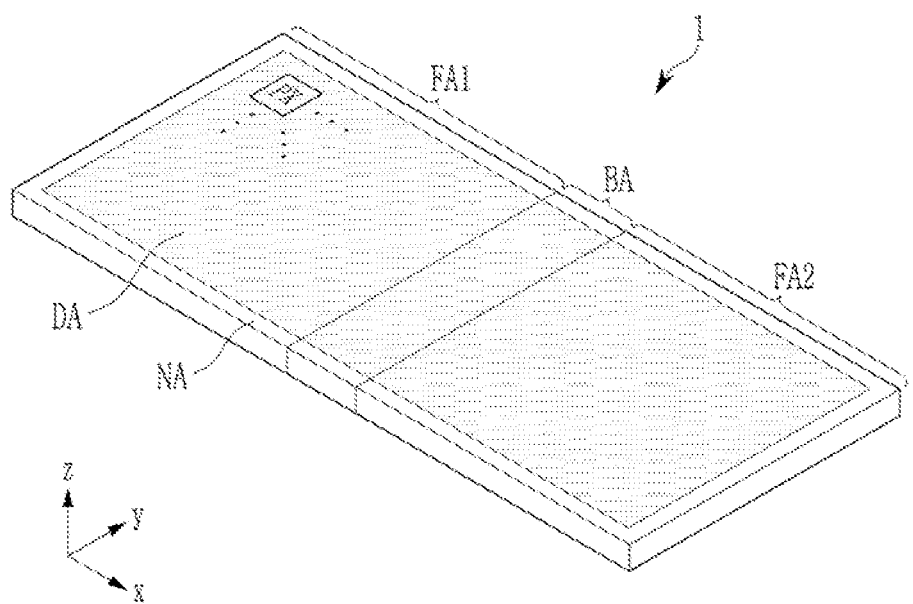
FIGS. 1-3 are perspective views showing a flexible display device in an unfolded state, a first folding state, and a second folding state, respectively, according to embodiments of the present disclosure.

Embodiments of the present disclosure will be described in detail with reference to accompanying drawings.

Further, sizes and thicknesses of constituent members shown in the accompanying drawings may be arbitrarily given for better understanding and ease of description, but are not necessarily limited thereto.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

Throughout the specification, "connected" does not only mean that two or more constituent elements are directly connected, but may also mean that two or more constituent elements are connected indirectly through other constituent elements, and it may include an embodiment in which substantially integral parts are connected to each other even if they may be referred to by a different name depending on the position or function, as well as embodiments of being physically connected or electrically connected.

In the drawings, symbols "x", "y", and "z" representing a direction are used, where "x" is a first direction (the "X direction"), "y" is a second direction perpendicular to the first direction (the "Y direction"), and "z" is a third direction (the "Z direction") perpendicular to the first direction and the second direction.

Figure 2:
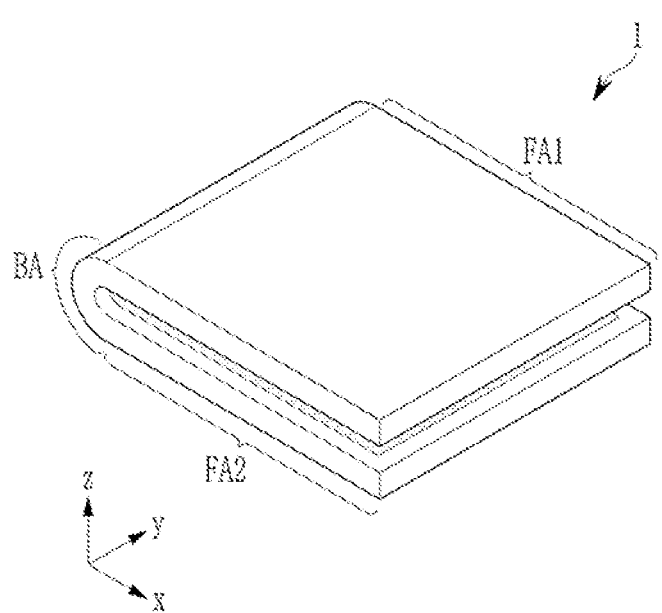
Figure 3:
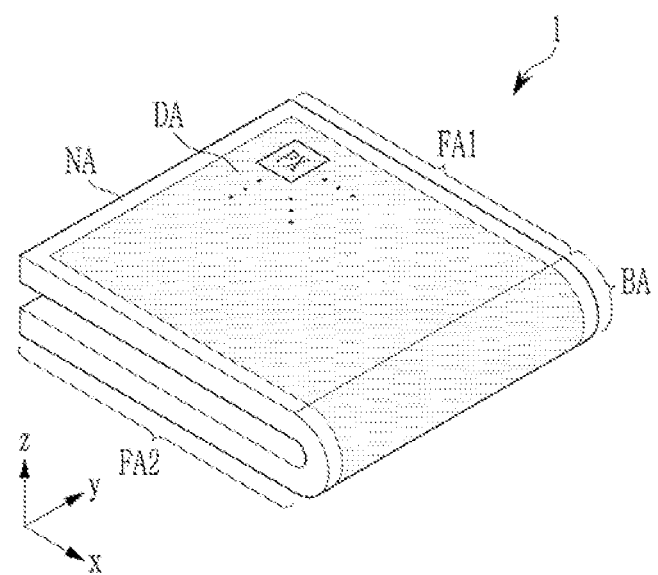

FIG. 1, FIG. 2, and FIG. 3 are perspective views schematically showing a flexible display device according to embodiments of the present disclosure. FIG. 1, FIG. 2, and FIG. 3 shows an unfolded state, a first folding state, and a second folding state of the flexible display device, respectively.

The flexible display device 1 (hereinafter, simply referred to as "a display device"), as shown in FIG. 1, may be unfolded flat as a whole, and as shown in FIG. 2 and/or FIG. 3, may be a foldable display device that may be folded, such as being folded in a first folding state (FIG. 2) and a second folding state (FIG. 3). The display device 1 may include a bendable region BA, and a first flat region FA1 and a second flat region FA2 on both sides of the bendable region BA (e.g., in the X direction). The bendable region BA may be a bent portion when the display device 1 is folded, and the first flat region FA1 and the second flat region FA2 may be a non-bending portion.

Although one bendable region BA is shown, embodiments of the present disclosure are not necessarily limited thereto. For example, the display device 1 may include a plurality of bendable regions BA spaced apart from each other or bent with different curvature radii. For example, in an embodiment, the display device 1 may include two or more bendable regions and three or more flat regions.

The display device 1 may include a display area DA in which an image is displayed and a non-display area NA surrounding the display area DA. The display area DA may correspond to a screen on which pixels PX are arranged. While an embodiment as shown in FIG. 1 includes the non-display area NA completely surrounding the display area DA in a plan view (e.g., in the X and Y directions), embodiments of the present disclosure are not necessarily limited thereto. For example, in an embodiment, the non-display area NA may not surround at least one side of the display area DA. The non-display area NA may correspond to a bezel. The display device 1 may include a display panel having a screen, and may include a cover window that covers the display panel.

The display device 1, as shown in FIG. 2, may be folded in a first folding state (hereinafter, referred to as in-folding) so that the parts of the screen face each other. For example, the screen part of the first flat region FA1 and the screen part of the second flat region FA2 may face each other. The display device 1, as shown in FIG. 3, may be folded in a second folding state (hereinafter, referred to as out-folding) so that the screen is exposed to the outside. In the in-folding state, the screen portion of the bendable region BA may be covered. In the out-folding state, the screen portion of the bendable region BA may be exposed to be visible for the user. In an embodiment, the display device 1 may be designed so that only one of the in-folding and the out-folding is possible or both are possible. In an embodiment in which the display device 1 includes a plurality of bendable regions BA, one of them may be the bendable region that is in-foldable and the other may be the bendable region that is out-foldable.

Figure 4:
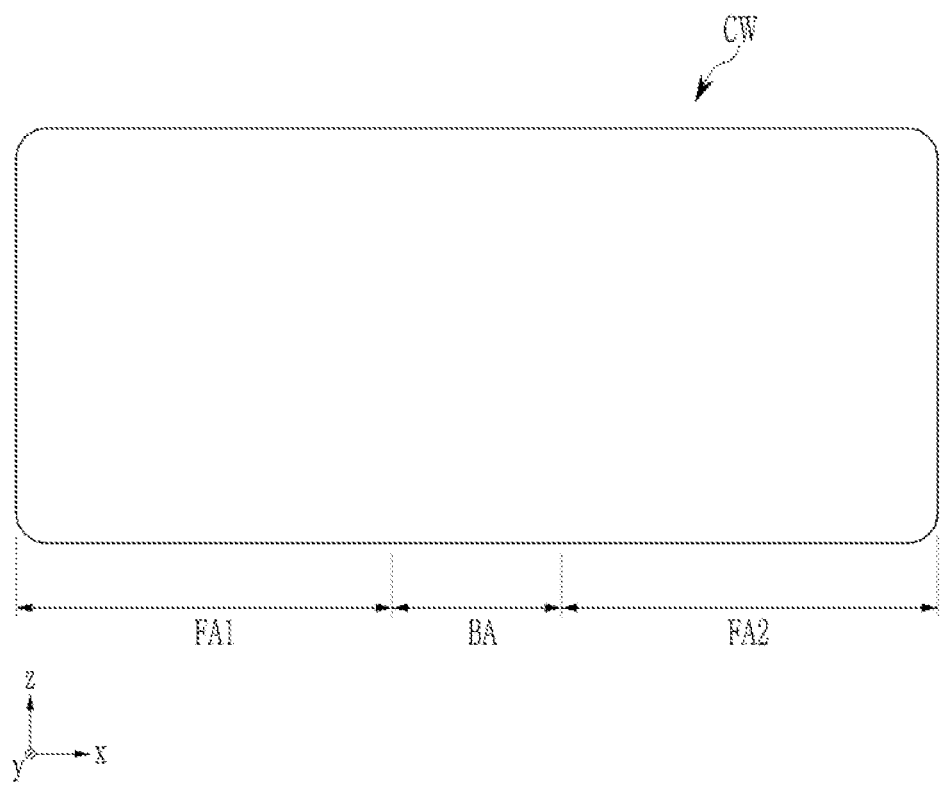
FIG. 4 is a top plan view of a cover window according to an embodiment of the present disclosure.
Figure 5:
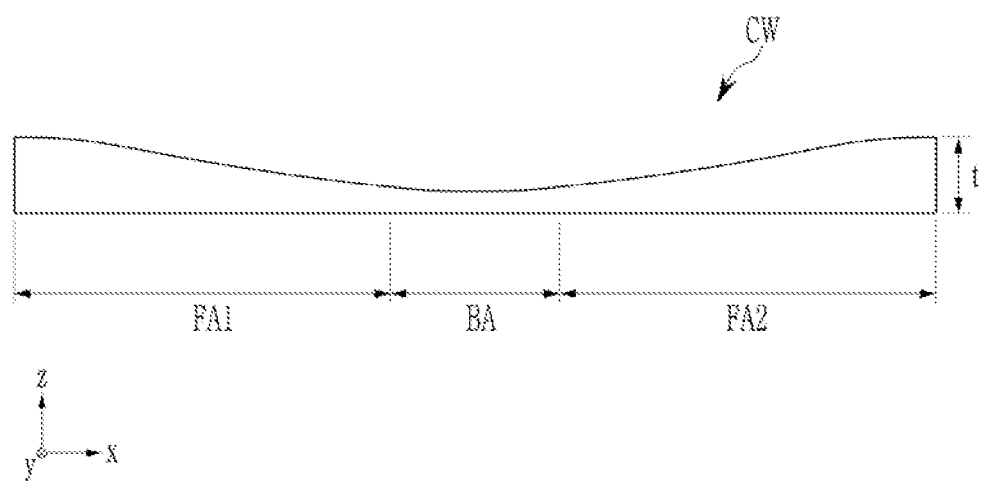
FIG. 5 and FIG. 6 are side views of a cover window according to embodiments of the present disclosure.
Figure 6:
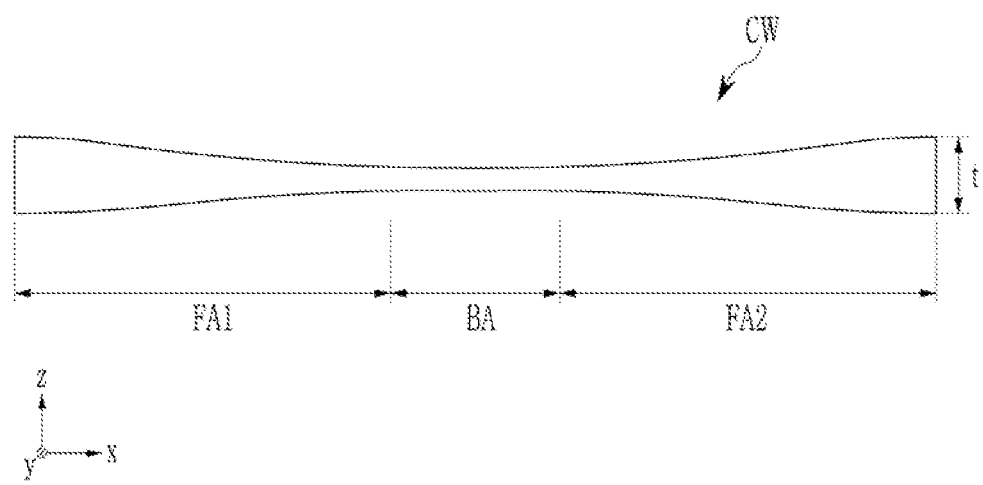

FIG. 4 is a top plan view of a cover window according to an embodiment of the present disclosure, and FIG. 5 and FIG. 6 are side views of a cover window according to an embodiment of the present disclosure, respectively.

Referring to FIGS. 4-6, in an embodiment, the cover window CW may have a planar shape of a rectangle as a whole. However, embodiments of the present disclosure are not necessarily limited thereto and the planar shape of the cover window CW (e.g., in a plane defined in the X and Y directions) may vary. In an embodiment, the cover window CW may have rounded corners, but may also be angled. In an embodiment, the cover window CW may be formed of transparent and hard materials such as glass and quartz.

The cover window CW may include a portion where a thickness t (e.g., length in the Z direction) varies along the X direction. For example, in an embodiment as shown in FIG. 5, the central portion (e.g., in the X direction) of the cover window CW is thinnest and the thickness t may increase as the distance from the central portion increases. In this embodiment, the central portion of the cover window CW may correspond to the bendable region BA of the display device. In an embodiment, the thickness t of the thinnest part of the cover window CW may be in a range of about 50 μm or less, 40 μm or less, or about 30 μm. For example, in an embodiment, the thickness t of the thinnest part of the cover window CW may be in a range of about 10 μm to about 30 μm, or about 20 μm to about 50 μm. The thickness t of the thickest part of the cover window CW may be in a range of about 50 μm or more, about 60 μm or more, or about 70 μm or more. For example, in an embodiment, the thickness t of the thickest part of the cover window CW may be in a range of about 50 μm to about 100 μm, or about 70 μm to about 200 μm. The cover window CW may be bendable in the bendable region BA with the relatively thin thickness t, and may provided increased protection of the display device from the environment (e.g., an external impact) in the first and second flat regions FA1 and FA2 with the relatively thick thickness t.

In an embodiment, the thickness t of the cover window CW may be smoothly changed with the slope of the surface. For example, the thickness t of the cover window CW may be changed gradually over the entire region. For example, when the cover window CW is folded about an axis parallel to the Y direction, the cover window CW is the thinnest in the central portion and may gradually increase toward the edge along the X direction. In an embodiment, the thickness t of the cover window CW may be constant along the Y direction. The cover window CW may include a portion with a constant thickness t in the first and second flat regions FA1 and FA2. For example, in the first and second flat regions FA1 and FA2, the thickness t may be changed gradually only in the portion adjacent to the bendable region BA, and the thickness t may be constant in the remaining portions.

For the change of the thickness t of the cover window CW, as shown in FIG. 5, one surface of both surfaces of the cover window CW may be at least partially curved, and the other surface may be entirely flat. For example, as shown in an embodiment of FIG. 5, the upper surface of the cover window CW (e.g., in the Z direction) may be at least partially curved and the lower surface (e.g., in the Z direction) may be entirely flat. However, embodiments of the present disclosure are not necessarily limited thereto. For example, in an embodiment, as shown in FIG. 6, both surfaces (e.g., upper and lower surfaces in the Z direction) of the cover window CW may be at least partially curved surfaces, such as at least partially concave curved surfaces. In an embodiment in which both surfaces of the cover window CW are concave curved surfaces, the two curved surfaces may be symmetrical or asymmetrical with respect to the central axis of the horizontal direction of the cover window CW.

If the thickness t of the cover window CW is kept constant and thinned only in the bendable region BA, a step difference may occur between the bendable region BA and the first and second flat regions FA1 and FA2, and then a boundary may be seen. In addition, when the cover window CW and the display panel are attached using an adhesive, the adhesive may not completely fill in the step portion which may cause a vapor to be generated, and the boundary may be more clearly seen because of the vapor. On the other hand, if the cover window CW is formed thin as a whole, the folding characteristic (e.g., the flexibility) of the cover window CW is increased, but the cover window CW may be vulnerable to an external impact such as a pen drop. In an embodiment of the present disclosure, the thickness t of the cover window CW does not change rapidly at the boundary between the bendable region BA and the first and second flat regions FA1 and FA2, but changes gradually, thereby preventing the boundary from being recognized, and it is possible to stabilize a gradation morphology at the boundary of the bendable region BA and the first and second flat regions FA1 and FA2. In addition, it is possible to reduce the region that is vulnerable to impact in the cover window CW.

Figure 7:
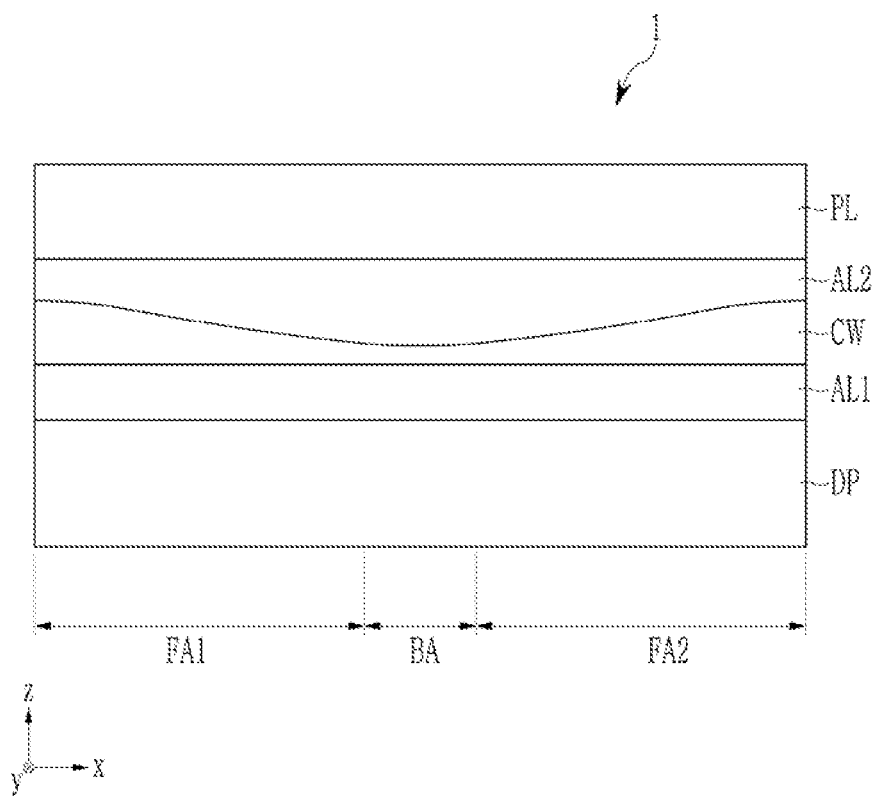
FIGS. 7-9 are side views of a display device according to embodiments of the present disclosure.
Figure 8:
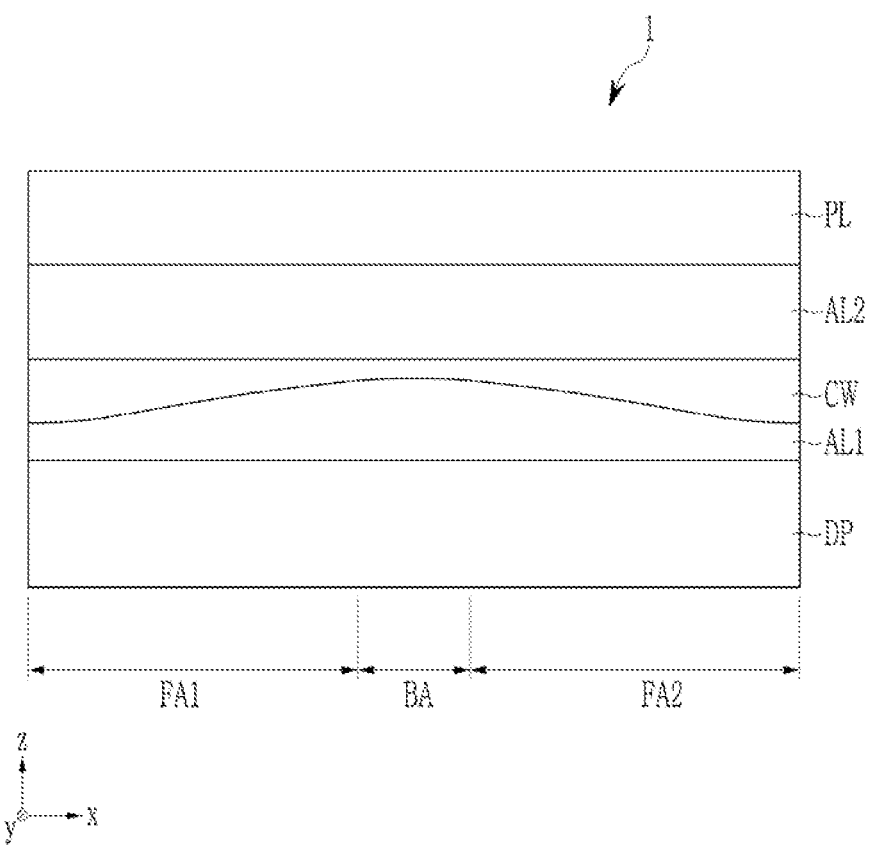
Figure 9:
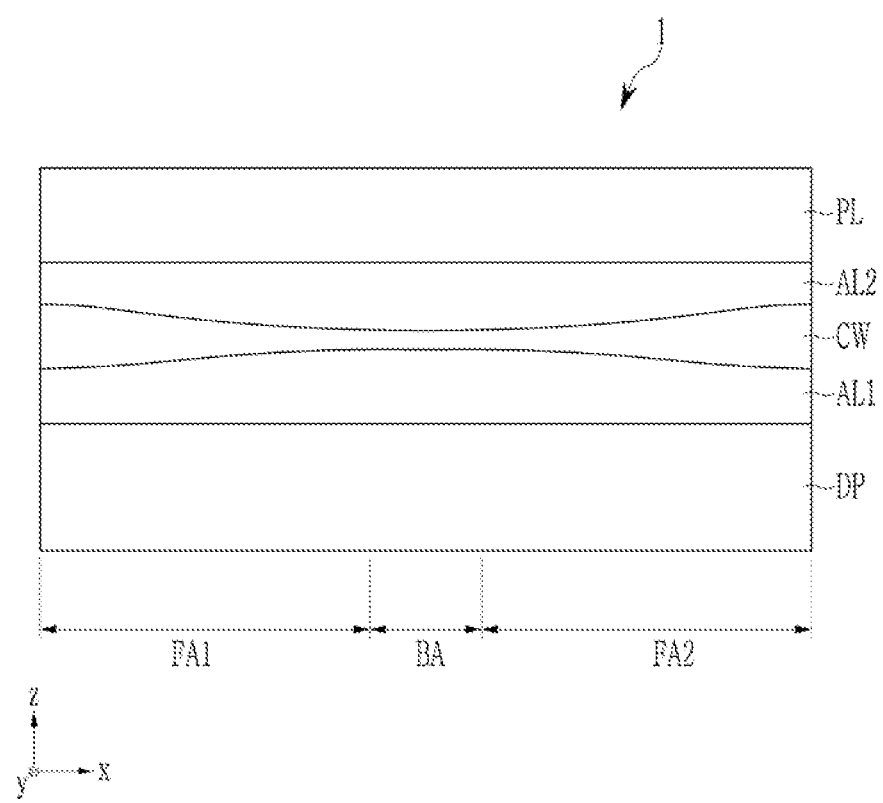

FIGS. 7-9 are side views of a display device according to embodiments of the present disclosure.

Referring to FIG. 7, the display device 1 may include a cover window CW, a display panel DP, and a first adhesive layer AL1 between the cover window CW and the display panel DP. The display panel DP, which may be a light emission display panel, may be attached to the cover window CW by the first adhesive layer AL1. In an embodiment as shown in FIG. 7, the cover window CW may be positioned with the flat surface facing the display panel DP. However, embodiments of the present disclosure are not necessarily limited thereto. The display device 1 may include a protection layer PL, positioned on the cover window CW, and the cover window CW may be positioned so that a concave surface faces the protection layer PL. The protection layer PL may be attached to the cover window CW by a second adhesive layer AL2. In an embodiment, the protection layer PL may be a plastic film including a polymer such as polyethylene terephthalate, polyethylene naphthalate, polyimide, and the like. However, embodiments of the present disclosure are not necessarily limited thereto. The first and second adhesive layers AL1 and AL2 may include an optically transparent adhesive (OCA), an optically transparent resin (OCR), a pressure-sensitive adhesive (PSA), or the like. However, embodiments of the present disclosure are not necessarily limited thereto.

A relatively thin portion of the cover window CW may be positioned in the bendable region BA. Accordingly, the flexibility of the cover window CW and the display device 1 in the bendable region BA may be increased. The concave portion of the cover window CW may be filled with the adhesive layer AL2. Since the thickness of the cover window CW changes gradually, and the concave portion may be filled with the adhesive layer AL2 without the vapor, the folding characteristic of the cover window CW may be increased and the boundary between the thin region and the thick region may be prevented from being visible.

The thickness of the second adhesive layer AL2 is not constant, and may have a thickness distribution opposite to that of the cover window CW. For example, the second adhesive layer AL2 may be thick in the bendable region BA where the thickness of the cover window CW is thin, and may be thin in the flat region FA1 and FA2 where the thickness of the cover window CW is thick. The combined thickness (e.g., length in the Z direction) of the cover window CW and the adhesive layer AL2 may be substantially uniform over the entire region of the display device 1 (e.g., along the X direction). By forming the thick adhesive layer AL2 in the region where the thickness of the cover window CW is thin, the thickness difference of the cover window CW may be compensated, the impact resistance of the bendable region BA of the cover window CW may be increased, and the flatness may be increased.

In an embodiment, the display device 1 may further include a housing, and several parts constituting the display device 1, such as the display panel DP, driving device, printed circuit board (PCB), application processor, memory, battery, speaker, sensor, etc., may be positioned in a space defined by the cover window and the housing.

Referring to FIG. 8, in the arrangement of the cover window CW, there is a difference as compared to the embodiment of FIG. 7. In an embodiment as shown in FIG. 8, the cover window CW may be disposed so that the concave surfaces face the display panel DP. The concave portion of the cover window CW can be filled with the first adhesive layer AL1. Similarly to the second adhesive layer AL2 in the embodiment of FIG. 7, the thickness of the first adhesive layer AL1 is not constant, and may have a thickness distribution opposite to that of the cover window CW. The thickness of the second adhesive layer AL2 may be constant. Since the first and second adhesive layers AL1 and AL2 may be more easily stretched than the cover window CW, the display device 1 of an embodiment show in FIG. 7 may be advantageous for the out-folding and an embodiment as shown in FIG. 8 may be advantageous for the in-folding of the display device 1. However, embodiments of the present disclosure are not necessarily limited thereto.

Referring to FIG. 9, the display device 1 may include the cover window CW in which both surfaces (e.g., upper and lower surfaces in the Z direction) are concave. One surface of both concave surfaces of the cover window CW may face the display panel DP, and the other surface may face the protection layer PL. The concave portions of the cover window CW may be filled with the first and second adhesive layers AL1 and AL2. The first and second adhesive layers AL1 and AL2 have the non-uniform thickness and may have the thickness distribution opposite to that of the cover window CW. The entire thickness (e.g., combined thicknesses in the Z direction) of the cover window CW and the first and second adhesive layers AL1 and AL2 may be substantially uniform over the entire region of the display device 1 (e.g., along the X direction). The first and second adhesive layers AL1, AL2 may compensate for the thickness difference of the cover window CW on both sides of the cover window CW, and increase the impact resistance of the bendable region BA and the flatness of the display device 1. As in the above-described embodiments, the relatively thin portion of the cover window CW is positioned on the bendable region BA, so that the flexibility of the bendable region BA may be increased. Hereinafter, a method for manufacturing the cover window CW whose thickness t changes gradually is described.

FIGS. 10-13 are views schematically showing a manufacturing method of a cover window according to embodiments of the present disclosure.

Figure 10:
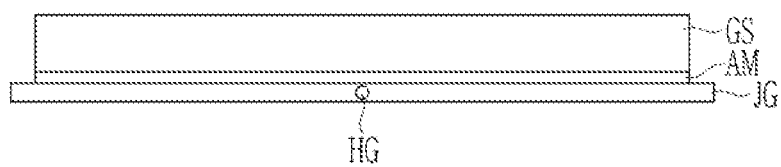
FIGS. 10-13 are views showing a manufacturing method of a cover window according to embodiments of the present disclosure.

Referring to FIG. 10, the glass substrate GS may be attached to the jig JG including the hinge HG using the adhesive member AM. The jig JG and the glass substrate GS attached thereto may be folded around the hinge HG. In an embodiment, the jig JG may have a flat surface or a plate-shaped surface in contact with the adhesive member AM.

In an embodiment, the glass substrate GS may have a constant thickness (e.g., about 100 µm) over the entire region and may be optically transparent. The glass substrate GS may be a cell unit (corresponding to one cover window) or a mother glass unit (corresponding to a plurality of cover windows).

In an embodiment, the adhesive member AM may be a two-sided adhesive tape, or a photo-curable resin or photoresist. However, embodiments of the present disclosure are not necessarily limited thereto. For example, after attaching the two-sided adhesive tape to the jig JG, the glass substrate GS is attached on the two-sided adhesive tape, or after attaching the two-sided adhesive tape to one surface of the glass substrate GS, the glass substrate GS to which the two-sided adhesive tape is attached may be attached to the jig JG. However, embodiments of the present disclosure are not necessarily limited thereto. For example, in an embodiment, the glass substrate GS may be attached to the jig JG by curing the adhesive after coating an adhesive such as a photo-curable resin or a photoresist to one surface of the glass substrate GS and bonding the jig JG. The adhesive member AM may be formed of a material that is not etched into an etchant for etching the glass substrate GS. For example, the adhesive member AM may be formed of a material that does not react with the etchant.

Figure 11:
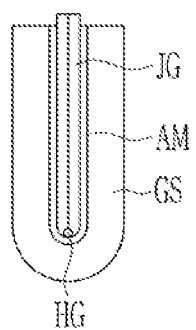

Referring to FIG. 11, the jig JG to which the glass substrate GS is attached may be folded so that the glass substrate GS may be exposed to the outside. At this time, the glass substrate GS can be folded together with the jig JG in the state that it is attached to the jig JG. In the folded state, the jig JG may be positioned in the space defined by the glass substrate GS. The glass substrate GS may include a bent portion by the folding, and the bent portion may be adjacent to the hinge HG. Although the glass substrate GS may be shown with the folded state in an approximate U-shape (e.g., substantially a U-shape) in FIG. 11, embodiments of the present disclosure are not necessarily limited thereto. For example, in an embodiment, the glass substrate GS may be folded in an approximate V-shape (e.g., substantially a V-shape), etc.

Figure 12:
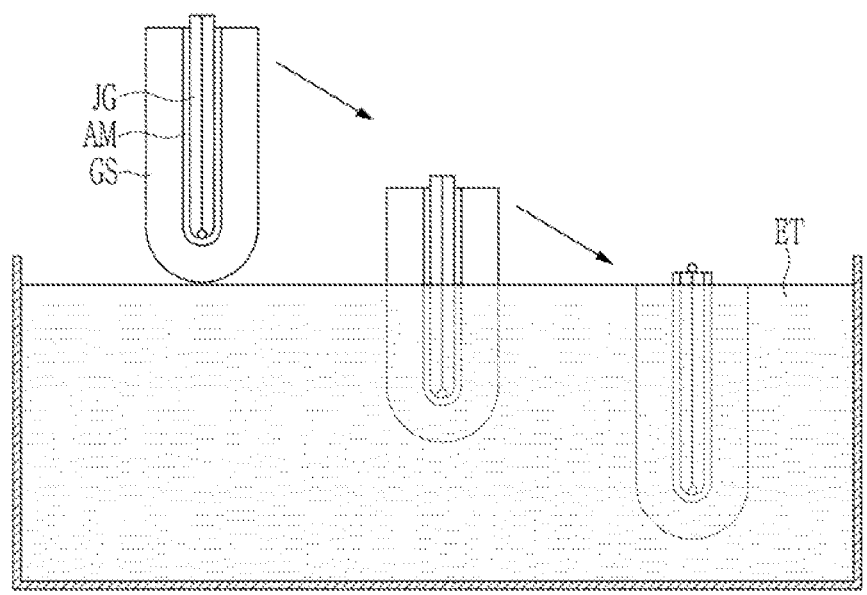
Figure 13:
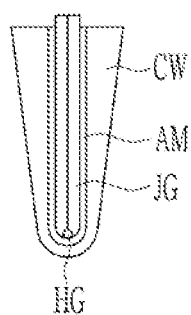

Referring to FIG. 12, the exposed surface of the glass substrate GS may be wet-etched by immersing the folded jig JG and glass substrate GS into an etchant ET. The etchant ET may be housed in any type of container that is able to hold the etchant ET and receive the folded jig JG and glass substrate GS. In an embodiment, the etchant (ET) may include hydrofluoric acid (HF). However, embodiments of the present disclosure are not necessarily limited thereto. The glass substrate GS may be immersed in the etchant ET from the bent portion. For example, the bent portion of the glass substrate GS adjacent to the hinge HG may be first immersed in the etchant ET. At this time, the glass substrate GS may not be immersed in the etchant ET at once, but may be immersed gradually from the bent portion towards edge portions. Here, to be gradually immersed may mean to be gradually immersed at a speed that may cause a certain difference amount (e.g., about 30% or more or about 50% or more) in etching between the first immersed part and the last immersed part of the glass substrate GS. For example, a first portion that includes the bent portion of the glass substrate GS may be first immersed in the etchant ET and a second portion that does not include the bent portion of the glass substrate GS may be subsequently immersed in the etchant. In an embodiment, the difference between the etching of the first portion and the second portion due to this immersion process may be in a range of about 30% or more or about 50% or more. The speed at which the glass substrate GS is gradually immersed may vary depending on the etching speed of the glass substrate GS according to the etching process variables such as a concentration and a temperature. The gradually immersed speed may be constant or changed from the time when the bent portion of the glass substrate GS is immersed to the time when the edge portion is immersed. For example, the bent part may be immersed relatively slowly, and the upper part of the bent part may be immersed relatively slowly. However, embodiments of the present disclosure are not necessarily limited thereto. For example, in an embodiment, the folded glass substrate GS may be divided into n parts in the length direction, and the glass substrate GS may be immersed with a time difference of 1/n from the bent portion.

In this way, if the folded glass substrate GS is gradually immersed in the etchant ET in a dipping method, the first immersed part (e.g., the first portion) has a longer reaction time with the etchant ET than the later immersed part, so that the part immersed first may be etched more than the part immersed later (e.g., the second portion). The etching time of the glass substrate GS may be set in consideration of the etching amount. For example, in an embodiment, the etching may proceed until the thickness of the thinnest part of the glass substrate GS (e.g., the bent part of the glass substrate GS) reaches a target thickness (e.g., about 30 µm). Among both surfaces of the glass substrate GS, only one surface in contact with the etchant ET is etched, and the other surface is covered by the adhesive member AM that is not etched by the etchant ET, so the other surface may not be etched.

Referring to FIG. 12, when the etching of the glass substrate GS is gradually completed, the glass substrate GS can be taken out from the etchant ET. As a result, the center of the bent part is thinnest, and a thickness of the cover window CW which gradually increases from the bent part to the edge part may be obtained. The cover window CW may then be separated from the jig JG and the adhesive member AM, and may be cleaned and dried.

In the cover window CW manufactured in embodiments shown in FIGS. 10-12, the thickness of the bendable region BA is relatively thin and the thickness may gradually increase toward the edges of the first and second flat regions FA1 and FA2. Therefore, it is possible to increase the impact resistance of the first and second flat regions FA1 and FA2 in the cover window CW, and the flexible characteristic of th bendable region BA may be increased so there may be no step difference between the bendable region BA and the first and second flat regions FA1 and FA2, and the boundary may not be visible.

The increased impact resistance of the first and second flat regions FA1 and FA2 may not only provide increased protection to the display panel DP, but also prevent damage of the cover window CW itself. For example, in the process step, the cover window CW (or the glass substrate GS) may be loaded in a cassette and transported. Since the portion contacting the cassette, (e.g., the first and second flat regions FA1 and FA2), may be formed with a predetermined thickness by selective etching, a breakage rate of the portion contacting the cassette may be reduced and a yield may be increased.

By the etching step, the cover window CW conforming to a predetermined dimension may be manufactured, but a step to increase the strength of the cover window CW, such as a step of chemically strengthening the cover window CW may also be performed. In an embodiment, the chemical strengthening step may include replacing ions of the cover window CW with other ions. For example, when the cover window CW is immersed in a molten alkali salt of a high temperature, a part of sodium ions ($Na^+$) on the surface of the cover window CW is exchanged with potassium ions ($K^+$). Potassium ions ($K^+$) are larger than sodium ions ($Na^+$), and upon cooling, a compressive stress layer may be formed, thereby increasing the strength of the cover window CW.

In the manufactured cover window CW, as shown in an embodiment of FIG. 7, the unetched flat surface may be attached to the display panel DP by the first adhesive layer AL1, and the etched concave surface may be attached to the protection layer PL by the second adhesive layer AL2. In the cover window CW, as shown in an embodiment of FIG. 8, the etched concave surface may be attached to the display panel DP by the first adhesive layer AL1, and the unetched flat surface may be attached to the protection layer PL by the second adhesive layer AL2. In such embodiments, the gradual thickness change of the cover window CW may increase the folding characteristic and the appearance quality of the display device 1. In addition, the concave surface of the cover window CW is filled with an adhesive that forms the first and second adhesive layers AL1 and AL2, so that the impact resistance of the bendable region BA with the thin thickness of the cover window CW may be increased. In addition, the first and second adhesive layers AL1 and AL2 may prevent cracks from growing by preventing the etched concave surface of the cover window CW from coming into contact with moisture, etc., and may increase the resistance to breakage due to long-term fatigue.

In an embodiment, after gradually etching one surface of the glass substrate GS in the above-described manner, the other surface of the glass substrate GS is gradually etched in the above-described manner so that the cover window CW in which both surfaces are concave can be manufactured as shown in FIG. 6. In further detail, the gradually etched concave surface of the glass substrate GS may be attached to the jig JG using an adhesive member AM (referring to FIG. 10), and the jig JG may be folded so that the unetched flat surface of the glass substrate GS is exposed to the outside (referring to FIG. 11). The exposed surface of the glass substrate GS may then be gradually wet-etched by gradually dipping the bent part of the glass substrate GS on the folded jig JG into the etchant ET (referring to FIG. 12). At this time, since the previously etched surface of the glass substrate GS is covered by the adhesive member AM, it may not be additionally etched. In this way, by gradually etching both surfaces of the glass substrate GS, it is possible to manufacture the cover window CW having a thickness that gradually decreases from the edge to the center (e.g., the thickness gradually increases from the center to the edge).

The configuration of the display panel DP that may be included in the display device according to an embodiment is mainly described based on the display area DA.

Figure 14:
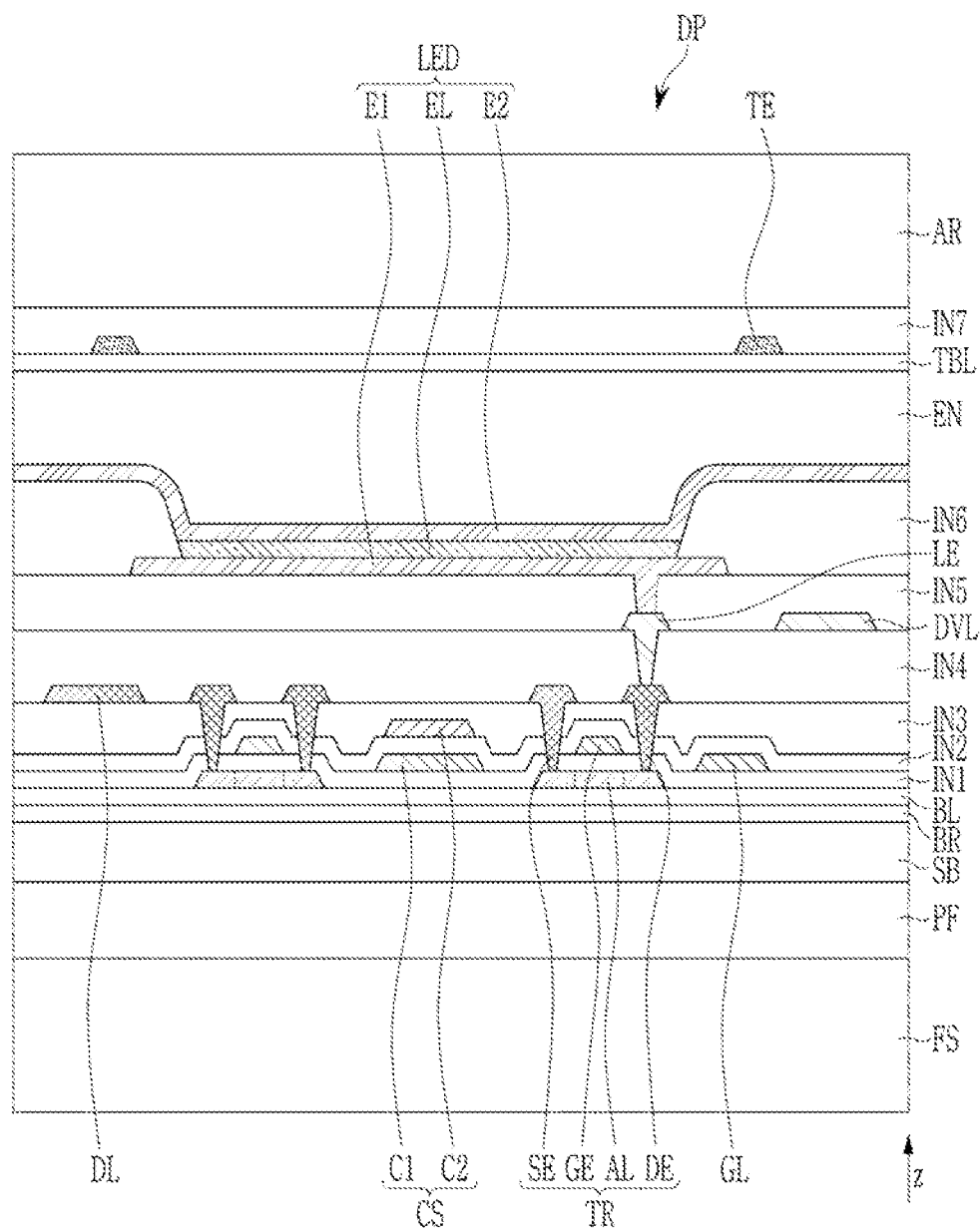
FIG. 14 is a cross-sectional view showing a display panel according to an embodiment of the present disclosure.

FIG. 14 is a cross-sectional view schematically showing a display panel according to an embodiment of the present disclosure.

Referring to FIG. 14, the display panel DP may basically include a substrate SB, a transistor TR formed on the substrate SB, and a light emitting diode LED LED connected to the transistor TR. The light emitting diode LED may correspond to the pixel PX. The cross-section shown in FIG. 14 may correspond to approximately one pixel area.

The substrate SB may be a flexible substrate made of a polymer such as polyimide, polyamide, or polyethylene terephthalate. However, embodiments of the present disclosure are not necessarily limited thereto.

A barrier layer BR that prevents penetration of moisture, oxygen, etc. may be positioned on the substrate SB (e.g., disposed directly thereon in the Z direction). In an embodiment, the barrier layer BR may include an inorganic insulating material such as a silicon nitride (SiNx), a silicon oxide (SiOx), or a silicon oxynitride (SiOxNy), and may be a single layer or multiple layers. However, embodiments of the present disclosure are not necessarily limited thereto.

A buffer layer BL may be positioned on the barrier layer BR (e.g., disposed directly thereon in the Z direction). In an embodiment, the buffer layer BL may include an inorganic insulating material such as a silicon nitride (SiNx), a silicon oxide (SiOx), or a silicon oxynitride (SiOxNy), and may be a single layer or multiple layers. However, embodiments of the present disclosure are not necessarily limited thereto.

A semiconductor layer AL of the transistor TR may be positioned on the buffer layer BL (e.g., disposed directly thereon in the Z direction). The semiconductor layer AL may include a first region, a second region, and a channel region between these regions. The semiconductor layer AL may include any one of amorphous silicon, polycrystalline silicon, and an oxide semiconductor. For example, the semiconductor layer AL may include low temperature polysilicon (LTPS) or an oxide semiconductor material including at least one of zinc (Zn), indium (In), gallium (Ga), and tin (Sn). For example, the semiconductor layer may include IGZO (Indium-Gallium-Zinc Oxide). However, embodiments of the present disclosure are not necessarily limited thereto.

A first insulating layer IN1 may be positioned on the semiconductor layer AL (e.g., disposed directly thereon in the Z direction). In an embodiment, the first insulating layer IN1 may include an inorganic insulating material such as a silicon nitride (SiNx), a silicon oxide (SiOx), or a silicon oxynitride (SiOxNy), and may be a single layer or multiple layers. However, embodiments of the present disclosure are not necessarily limited thereto.

A first gate conductive layer that may include a gate electrode GE of the transistor TR, a gate line GL, and a first electrode C1 of a capacitor CS may be positioned on the insulating layer IN1 (e.g., disposed directly thereon in the Z direction). In an embodiment, the first gate conductive layer may be formed of the same material in the same process. In an embodiment, the first gate conductive layer may include molybdenum (Mo), aluminum (Al), copper (Cu), titanium (Ti), etc., and may be a single layer or multiple layers. However, embodiments of the present disclosure are not necessarily limited thereto.

A second insulating layer IN2 may be positioned on the first gate conductive layer (e.g., disposed directly thereon in the Z direction). In an embodiment, the second insulating layer IN2 may include an inorganic insulating material such as a silicon nitride (SiNx), a silicon oxide (SiOx), or a silicon oxynitride (SiOxNy), and may be a single layer or multiple layers. However, embodiments of the present disclosure are not necessarily limited thereto.

A second gate conductive layer that may include a second electrode C2 of the capacitor CS and the like may be positioned on the insulating layer IN2 (e.g., disposed directly thereon in the Z direction). The second gate conductive layer may be formed of the same material in the same process. In an embodiment, the second gate conductive layer may include molybdenum (Mo), aluminum (Al), copper (Cu), titanium (Ti), or the like, and may be a single layer or multiple layers. However, embodiments of the present disclosure are not necessarily limited thereto.

A third insulating layer IN3 may be positioned on the second insulating layer IN2 and the second gate conductive layer (e.g., disposed directly thereon in the Z direction). In an embodiment, the insulating layer IN2 may include an inorganic insulating material such as a silicon nitride ($SiN_x$), a silicon oxide ($SiO_x$), or a silicon oxynitride ($SiO_xN_y$), and may be a single layer or multiple layers. However, embodiments of the present disclosure are not necessarily limited thereto.

A first data conductive layer that may include a first electrode SE and a second electrode DE of the transistor TR, a data line DL, etc. may be positioned on the third insulating layer IN3 (e.g., disposed directly thereon in the Z direction). In an embodiment, the first electrode SE and the second electrode DE may be respectively connected to the first region and the second region of the semiconductor layer AL through contact holes extending through the first to third insulating layers IN1, IN2, and IN3. One of the first electrode SE and the second electrode DE may be a source electrode and the other may be a drain electrode. The first data conductive layer may be formed of the same material in the same process. In an embodiment, the first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), etc., and may be a single layer or a multilayer. However, embodiments of the present disclosure are not necessarily limited thereto.

A fourth insulating layer IN4 may be positioned on the first data conductive layer (e.g., disposed directly thereon in the Z direction). In an embodiment, the fourth insulating layer IN4 may include an organic insulating material such as a general-purpose polymer such as poly(methyl methacrylate) or polystyrene, a polymer derivative with a phenolic group, an acryl-based polymer, an imide-based polymer, a polyimide, an acryl-based polymer, or a siloxane-based polymer. However, embodiments of the present disclosure are not necessarily limited thereto.

A second data conductive layer that may include a driving voltage line DVL, a connection electrode LE, and the like may be positioned on the fourth insulating layer IN4 (e.g., disposed directly thereon in the Z direction). The connection electrode LE may be connected to the second electrode DE through a contact hole extending through the fourth insulating layer IN4. The second data conductive layer may be formed of the same material in the same process. In an embodiment, the second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), etc., and may be a single layer or multiple layers. However, embodiments of the present disclosure are not necessarily limited thereto.

A fifth insulating layer IN5 may be positioned on the second data conductive layer (e.g., disposed directly thereon in the Z direction). In an embodiment, the fifth insulating layer IN5 may include an organic insulating material such as a general-purpose polymer such as poly(methyl methacrylate) or polystyrene, a polymer derivative with a phenolic group, an acryl-based polymer, an imide-based polymer, a polyimide, an acryl-based polymer, or a siloxane-based polymer. However, embodiments of the present disclosure are not necessarily limited thereto.

The first electrode E1 of the light emitting diode LED may be positioned on the insulating layer IN5 (e.g., disposed directly thereon in the Z direction). The first electrode E1 may be referred to as a pixel electrode. The first electrode E1 may be connected to the connection electrode LE through a contact hole extending through the fifth insulating layer IN5. In an embodiment, the first electrode E1 may be electrically connected to the second electrode DE to receive a driving current for controlling the luminance of the light emitting diode LED. The transistor TR to which the first electrode E1 is connected may be a driving transistor or a transistor electrically connected to the driving transistor. The first electrode E1 may be formed of a reflective conductive material or a semi-transmissive conductive material, or may be formed of a transparent conductive material. In an embodiment, the first electrode E1 may include a transparent conductive material such as indium tin oxide (ITO) or indium zinc oxide (IZO). The first electrode E1 may include a metal or a metal alloy such as lithium (Li), calcium (Ca), aluminum (Al), silver (Ag), magnesium (Mg), or gold (Au). However, embodiments of the present disclosure are not necessarily limited thereto.

A sixth insulating layer IN6 may be positioned on the fifth insulating layer IN5 (e.g., disposed directly thereon in the Z direction). The sixth insulating layer IN6 may be referred to as a pixel defining layer or a barrier rib, and may have an opening overlapping with the first electrode E1. In an embodiment, the fifth insulating layer IN5 may include an organic insulating material such as an acryl-based polymer or an imide-based polymer. However, embodiments of the present disclosure are not necessarily limited thereto.

An emission layer EL may be positioned on the first electrode E1 (e.g., in the Z direction). In an embodiment, on the first electrode E1, in addition to the emission layer EL, at least one of a hole injection layer, a hole transport layer, an electron transport layer, and an electron injection layer may be positioned.

A second electrode E2 may be positioned on the emission layer EL (e.g., in the Z direction). The second electrode E2 may be referred to as a common electrode. In an embodiment, the second electrode E2 may be formed of a thin layer made of a metal or metal alloy having a low work function, such as calcium (Ca), barium (Ba), magnesium (Mg), aluminum (Al), and silver (Ag), to have light transmittance. The second electrode E2 may include a transparent conductive oxide such as indium tin oxide (ITO) or indium zinc oxide (IZO). However, embodiments of the present disclosure are not necessarily limited thereto.

The first electrode E1, the emission layer EL, and the second electrode E2 of each pixel PX may form a light emitting diode LED such as an organic light emitting diode. In an embodiment, the first electrode E1 may be an anode of the light emitting diode LED, and the second electrode E2 may be a cathode of the light emitting diode LED.

An encapsulation layer EN may be positioned on the second electrode E2 (e.g., disposed directly thereon in the Z direction). The encapsulation layer EN encapsulates the light emitting diode LED to prevent penetration of moisture or oxygen from the outside. In an embodiment, the encapsulation layer EN may be a thin film encapsulation layer including at least one inorganic layer and at least one organic layer.

A buffer layer TBL may be positioned on the encapsulation layer EN (e.g., disposed directly thereon in the Z direction). In an embodiment, the buffer layer TBL may include an inorganic insulating material such as a silicon nitride ($SiN_x$), a silicon oxide ($SiO_x$), and a silicon oxynitride ($SiO_xN_y$), and may be a single layer or multiple layers. However, embodiments of the present disclosure are not necessarily limited thereto.

A touch sensor layer including a touch electrode TE may be positioned on the buffer layer TBL (e.g., disposed directly thereon in the Z direction). The touch electrode TE may have a mesh shape with an opening overlapping the light emitting diode LED.

A seventh insulating layer IN7 covering the touch electrode TE may be positioned on the touch sensor layer (e.g., disposed directly thereon in the Z direction). In an embodiment, the seventh insulating layer IN7 may include an inorganic insulating material such as a silicon nitride ($SiN_x$), a silicon oxide ($SiO_x$), or a silicon oxynitride ($SiO_xN_y$), and may be a single layer or multiple layers. However, embodiments of the present disclosure are not necessarily limited thereto.

In an embodiment, an antireflection layer AR may be positioned on the insulating layer IN7 (e.g., disposed directly thereon in the Z direction) to reduce external light reflection. The antireflection layer AR may include a polarization layer. The antireflection layer AR may be attached by an adhesive or formed on the insulating layer IN7.

In an embodiment, a protection film PF to protect the display panel DP may be positioned under the substrate SB (e.g., disposed directly thereunder in a direction opposite to the Z direction). In an embodiment, the protection film PF may be made of a polymer such as polyethylene terephthalate, polyethylene naphthalate, or polyimide. However, embodiments of the present disclosure are not necessarily limited thereto.

In an embodiment, a functional sheet FS including at least one of a cushion layer, a heat dissipation sheet, a light blocking sheet, a waterproof tape, and an electromagnetic blocking film may be positioned under the protection film PF (e.g., disposed directly thereunder in a direction opposite to the Z direction).

While the present disclosure has been described in connection with embodiments thereof, it is to be understood that the present disclosure is not limited to the disclosed embodiments.

What is claimed is:

1. A manufacturing method of a cover window of a flexible display device, comprising:
    attaching a glass substrate to a jig, the jig including a hinge;
    folding the jig and the glass substrate around the hinge; and
    immersing the glass substrate and the jig in an etchant to etch the glass substrate.

2. The manufacturing method of the cover window of the flexible display device of claim 1, wherein:
    the glass substrate includes a bent portion adjacent to the hinge due to the folding; and
    the etching includes first immersing a first portion of the glass substrate that includes the bent portion in the etchant.

3. The manufacturing method of the cover window of the flexible display device of claim 2, wherein the etching includes immersing the glass substrate into the etchant from the first portion to a second portion of the glass substrate that does not include the bent portion.

4. The manufacturing method of the cover window of the flexible display device of claim 3, wherein the immersing includes immersing at a speed at which a difference in etch amount between first and last immersed parts of the glass substrate is about 30% or more.

5. The manufacturing method of the cover window of the flexible display device of claim 1, wherein the attaching includes using an adhesive member that does not react with the etchant to attach the glass substrate to the jig.

6. The manufacturing method of the cover window of the flexible display device of claim 5, wherein the adhesive member is a two-sided adhesive tape.

7. The manufacturing method of the cover window of the flexible display device of claim 5, wherein the adhesive member is a photocurable resin or a photoresist.

8. The manufacturing method of the cover window of the flexible display device of claim 1, wherein the folding includes folding the jig and the glass substrate so that the glass substrate is exposed outside.

9. The manufacturing method of the cover window of the flexible display device of claim 8, wherein the folding includes folding the jig and the glass substrate so that the jig is disposed in a space defined by the glass substrate.

10. The manufacturing method of the cover window of the flexible display device of claim 1, wherein the folding includes folding the glass substrate substantially into a U shape or a V shape.

11. A manufacturing method of a flexible display device comprising:
    attaching a glass substrate to a jig;

folding the jig and the glass substrate;

wet etching the glass substrate on the jig in an etchant to form a cover window having a thickness that increases from a center to an edge; and attaching a display panel to the cover window.

12. The manufacturing method of the flexible display device of claim 11, wherein:

the glass substrate includes a bent portion due to the folding; and the etching includes first immersing a first portion of the glass substrate that includes the bent portion in the etchant.

13. The manufacturing method of the flexible display device of claim 12, wherein the etching includes immersing the glass substrate into the etchant gradually from the first portion to a second portion of the glass substrate that includes the edge.

14. The manufacturing method of the flexible display device of claim 13, wherein the immersing includes an immersing at a speed at which a difference in etch amount between first and last immersed parts of the glass substrate is about 30% or more.

15. The manufacturing method of the flexible display device of claim 11, wherein the attaching includes using an adhesive member that is not etched by an etchant to attach the glass substrate to the jig.

16. The manufacturing method of the flexible display device of claim 11, further comprising:

attaching a concave surface of the cover window etched by the etching and a protection layer to each other by an adhesive layer having an adhesive; and the concave surface of the cover window is filled with the adhesive.

17. The manufacturing method of the flexible display device of claim 11, wherein:

the attaching of the display panel to the cover window includes attaching a concave surface of the cover window etched by the etching to the display panel by an adhesive layer having an adhesive; and the concave surface of the cover window is filled with the adhesive.

18. The manufacturing method of the flexible display device of claim 11, wherein the folding includes folding the jig and the glass substrate so that the glass substrate is exposed outside.

19. The manufacturing method of the flexible display device of claim 18, wherein the folding includes folding the jig and the glass substrate so that the jig is disposed in a space defined by the glass substrate.

20. The manufacturing method of the flexible display device of claim 11, wherein the folding includes folding the glass substrate substantially into a U-shape or a V-shape.

* * * * *